(12) United States Patent
Lee et al.

(10) Patent No.: US 11,502,155 B2
(45) Date of Patent: Nov. 15, 2022

(54) DISPLAY PANEL INCLUDING GROOVES SURROUNDED BY SIGNAL LINES

(71) Applicant: Samsung Display Co., LTD., Yongin-si (KR)

(72) Inventors: Sang Hoon Lee, Hwaseong-si (KR); Ki Nyeng Kang, Sejong-si (KR); Tae Woo Kim, Seoul (KR); Tae Hoon Yang, Yongin-si (KR); Seon Beom Ji, Seoul (KR); Jong Hyun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 170 days.

(21) Appl. No.: 17/004,802

(22) Filed: Aug. 27, 2020

(65) Prior Publication Data

US 2021/0210582 A1   Jul. 8, 2021

(30) Foreign Application Priority Data

Jan. 3, 2020   (KR) ........................ 10-2020-0000931

(51) Int. Cl.
*H01L 27/32* (2006.01)
*H01L 27/14* (2006.01)
(Continued)

(52) U.S. Cl.
CPC ...... *H01L 27/3276* (2013.01); *H01L 51/5253* (2013.01); *G02F 1/133331* (2021.01); *G02F 1/133512* (2013.01); *G02F 1/133528* (2013.01); *G02F 1/136209* (2013.01); *G09G 2300/0408* (2013.01); *G09G 2300/0804* (2013.01); *H01L 27/14678* (2013.01); *H01L 27/322* (2013.01); *H01L 27/323* (2013.01); *H01L 27/3246* (2013.01); *H01L 51/5072* (2013.01); *H01L 51/5092* (2013.01); *H01L 51/5221* (2013.01); *H01L 2251/301* (2013.01)

(58) Field of Classification Search
CPC ............ H01L 27/3276; H01L 27/3225; H01L 27/323; H01L 27/14678; H01L 27/322; H01L 27/3297; H01L 27/3246; H01L 27/3295; H01L 51/5253; H01L 51/5237; H01L 51/0072; H01L 51/5092; H01L 51/5221; H01L 2251/301; G02F 1/133528; G02F 1/133512; G02F 1/136209; G02F 1/133331; G02F 2001/133357; G09G 2300/0408; G09G 2300/0804

See application file for complete search history.

(56) References Cited

U.S. PATENT DOCUMENTS 9,997,738 B2   6/2018   Choi et al.
10,868,102 B1 *  12/2020  Zhang ................. H01L 51/5246
(Continued)

FOREIGN PATENT DOCUMENTS

JP   2018-87863   6/2018
KR   10-2017-0117291   10/2017

*Primary Examiner* — Ida M Soward
(74) *Attorney, Agent, or Firm* — Kile Park Reed & Houtteman PLLC

(57) ABSTRACT

A display device includes a substrate including an opening area in a display area and a non-display area between the display area and the opening area; signal wires disposed in the non-display area to bypass the opening area, and at least one groove disposed between the signal wires.

20 Claims, 20 Drawing Sheets

(51) Int. Cl.
*H01L 51/52* (2006.01)
*H01L 51/50* (2006.01)
*G02F 1/13* (2006.01)
  *G02F 1/1335* (2006.01)
  *G02F 1/1333* (2006.01)
  *H01L 27/146* (2006.01)
  *G02F 1/1362* (2006.01)

(56) References Cited

U.S. PATENT DOCUMENTS

| | | | |
|---|---|---|---|
| 2018/0102502 A1* | 4/2018 | Kim | H01L 27/3258 |
| 2020/0006701 A1* | 1/2020 | Lee | H01L 27/3258 |
| 2020/0027943 A1* | 1/2020 | Kim | H01L 51/5253 |
| 2020/0064968 A1* | 2/2020 | Kim | H01L 27/3276 |
| 2020/0083475 A1* | 3/2020 | Kang | H01L 27/3225 |
| 2020/0106045 A1* | 4/2020 | Han | H01L 27/3234 |
| 2020/0110495 A1* | 4/2020 | Han | G06F 3/0443 |
| 2020/0119304 A1* | 4/2020 | Choi | H01L 51/5237 |
| 2020/0159369 A1* | 5/2020 | Seo | G06F 3/045 |
| 2020/0161582 A1* | 5/2020 | Choi | H01L 27/326 |
| 2020/0168671 A1* | 5/2020 | Jang | G06F 3/04164 |
| 2020/0173949 A1* | 6/2020 | Lee | G01N 27/24 |
| 2020/0176538 A1* | 6/2020 | Um | H01L 27/3272 |
| 2020/0176539 A1* | 6/2020 | Sung | G09G 3/3233 |
| 2020/0176657 A1* | 6/2020 | Jang | G06F 1/1626 |
| 2020/0176709 A1* | 6/2020 | Moon | G06F 3/0443 |
| 2020/0235180 A1* | 7/2020 | Park | H01L 27/3276 |
| 2020/0313101 A1* | 10/2020 | Jung | H01L 27/3244 |
| 2021/0143370 A1* | 5/2021 | Choi | H01L 51/5253 |
| 2021/0234122 A1* | 7/2021 | Choi | H01L 51/0096 |
| 2021/0234125 A1* | 7/2021 | Sung | H01L 27/3258 |
| 2022/0020957 A1* | 1/2022 | Choi | H01L 27/3258 |

* cited by examiner

DISPLAY PANEL INCLUDING GROOVES SURROUNDED BY SIGNAL LINES

CROSS-REFERENCE TO RELATED APPLICATION(S)

This application claims priority to and benefits of Korean Patent Application No. 10-2020-0000931 under 35 U.S.C. § 119, filed in the Korean Intellectual Property Office on Jan. 3, 2020, the entire contents of which are incorporated herein by reference.

BACKGROUND

1. Technical Field

The disclosure relates to a display device.

2. Description of the Related Art

Display devices, which may be devices for displaying an image, include display panels such liquid crystal display (LCD) panels or organic light-emitting display panels including organic light-emitting diodes (OLEDs) or quantum dot-electroluminescent (QD-EL) devices.

As display devices may be utilized in a variety of electronic devices, the demand for techniques for increasing the display area-to-peripheral area ratio of display devices has increased. Typically, a display device may include holes in a display area in which to arrange electronic elements such as cameras, optical sensors, and thermal sensors.

In a case where the holes may be formed in the display area, a non-display area may be provided near the holes. The non-display area may include an area where moisture barrier grooves may be formed and a wiring bypass area where scan lines and data lines may be disposed. The holes displayed in the display area, however, may be perceived as defective pixels such as dark spots. Thus, research has been conducted on ways to reduce the size of the holes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure may provide for removing a groove area in a non-display area near holes that may be formed in a display area of a display device and also reducing the size of a non-display area by forming grooves in a wiring bypass area.

However, embodiments of the disclosure are not restricted to those set forth herein. The above and other embodiments of the disclosure will become more apparent to one of ordinary skill in the art to which the disclosure pertains by referencing the detailed description of the disclosure given below.

An embodiment of a display device may include a substrate including an opening area in a display area and a non-display area between the display area and the opening area, signal wires disposed in the non-display area to bypass the opening area, and at least one groove disposed between the signal wires.

The at least one groove may include two or more grooves, and each of the grooves may be disposed between adjacent ones of the signal wires.

The substrate may include a first base layer, a first inorganic layer, a second base layer, and a second inorganic layer, which may be sequentially stacked on each other.

A bottom of the at least one groove may be disposed on a surface of the second base layer.

A bottom of the at least one groove may be disposed in part of the second base layer.

The signal wires may include scan lines and data lines. The scan lines may be alternately arranged with an insulating layer disposed between the scan lines, and the data lines may be alternately arranged with an insulating layer disposed between the data lines.

The scan lines may include first scan lines disposed on a first insulating layer on the second inorganic layer, and second scan lines disposed on a second insulating layer on the first insulating layer. The data lines may include first data lines disposed on a third insulating layer on the second insulating layer, and second data lines disposed on a fourth insulating layer on the third insulating layer.

The first scan lines and the first data lines may be disposed to overlap each other in a thickness direction of the display device, and the second scan lines and the second data lines may be disposed to overlap each other in the thickness direction.

The at least one groove may include a plurality of grooves that are disposed between the first scan lines and the second scan lines and between the first data lines and the second data lines.

A width of the at least one groove in the second base layer may be greater than a width of the at least one groove in the second inorganic layer.

The third insulating layer may cover an inner surface of the at least one groove.

The display device may further include a fifth insulating layer disposed on the signal wires, and an organic light-emitting layer and a counter electrode layer sequentially stacked on each other on the fifth insulating layer.

The organic light-emitting layer and the counter electrode layer may be sequentially stacked on each other on a bottom of the at least one groove.

The display device may further comprise a thin-film encapsulation layer covering the display area and the non-display area.

The thin-film encapsulation layer may include a first inorganic encapsulation layer, an organic encapsulation layer, and a second inorganic encapsulation layer, which are sequentially stacked on each other.

The first inorganic encapsulation layer may cover an inner surface of the at least one groove.

The organic encapsulation layer may fill the at least one groove.

The display device may further comprise a partition wall disposed between the opening area and an area where the signal wires are disposed.

The first inorganic encapsulation layer and the second inorganic encapsulation layer may be sequentially stacked on each other on the partition wall.

The display device may further include a planarization layer disposed on a portion of the second inorganic encapsulation layer. The portion of the second inorganic encapsulation layer may be disposed between the partition wall and the opening area.

According to the aforementioned and other embodiments of the disclosure, a groove area can be removed from a non-display area near holes that may be formed in a display area, and the size of a non-display area can be reduced by forming grooves in a wiring bypass area.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
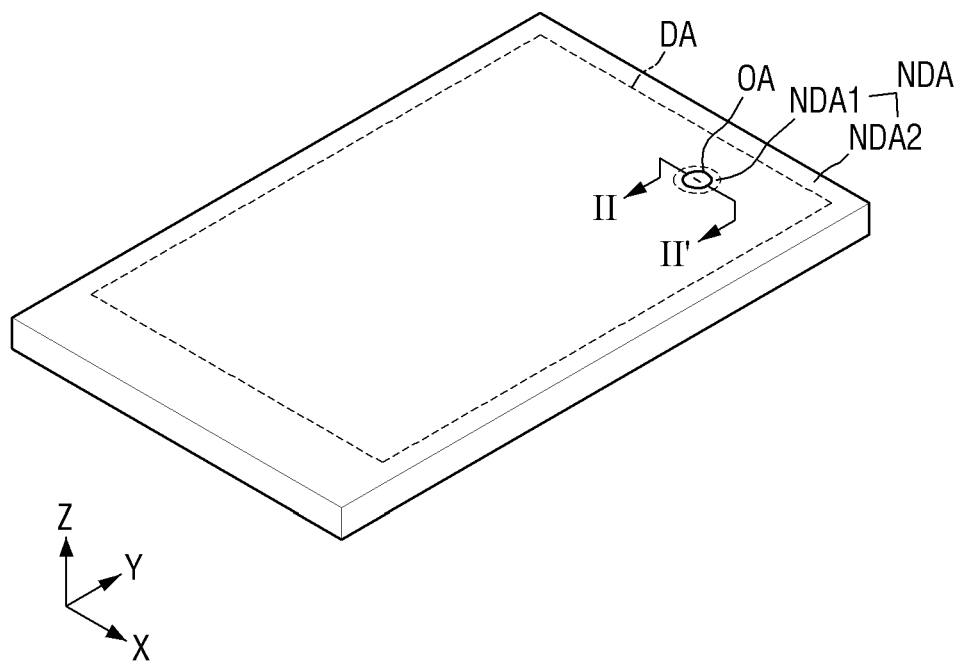
FIG. 1 is a schematic perspective view of a display device according to an embodiment of the disclosure.

Embodiments of the disclosure will hereinafter be described with reference to the accompanying drawings, wherein like reference numerals may denote the same elements. Advantages and features of the disclosure, and methods for accomplishing the same will be more clearly understood from embodiments described below. However, the disclosure is not limited to the following embodiments but may be implemented in various different forms.

When the position relation between two parts is described using the terms such as "on", "above", "below", and "next", one or more parts may be positioned between the two parts unless the terms are used with the term "immediately" or "directly". When an element or layer is referred to as being "on" another element or layer, it may be directly on the other element or layer, or intervening elements or layers may be present.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The term "overlap" may include layer, stack, face or facing, extending over, covering or partly covering or any other suitable term as would be appreciated and understood by those of ordinary skill in the art. The phrase "not overlap" may include apart from or set aside from or offset from and any other suitable equivalents as would be appreciated and understood by those of ordinary skill in the art.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

FIG. 1 is a schematic perspective view of a display device according to an embodiment of the disclosure.

Referring to FIG. 1, a display device 1 may include a display area DA, which emits light, and a non-display area NDA, which does not emit light. The display device 1 may provide an image using light emitted from pixels, which may be disposed in the display area DA.

The display device 1 may further include an opening area OA, which may be surrounded at least in part by the display area DA. FIG. 1 illustrates that the opening area OA may be generally surrounded by the display area DA. The non-display area NDA may include a first non-display area NDA1, which surrounds the opening area OA, and a second non-display area NDA2, which surrounds the display area DA. The first non-display area NDA1 may generally surround the opening area OA, the display area DA may generally surround the first non-display area NDA1, and the second non-display area NDA2 may generally surround the display area DA.

The display device 1 will hereinafter be described as being an organic light-emitting display device, but the disclosure is not limited thereto. As another example, various other display devices such as an inorganic electroluminescent (EL) display device or a quantum dot-electroluminescent (QD-EL) display device may be used as the display device 1.

Figure 2A:
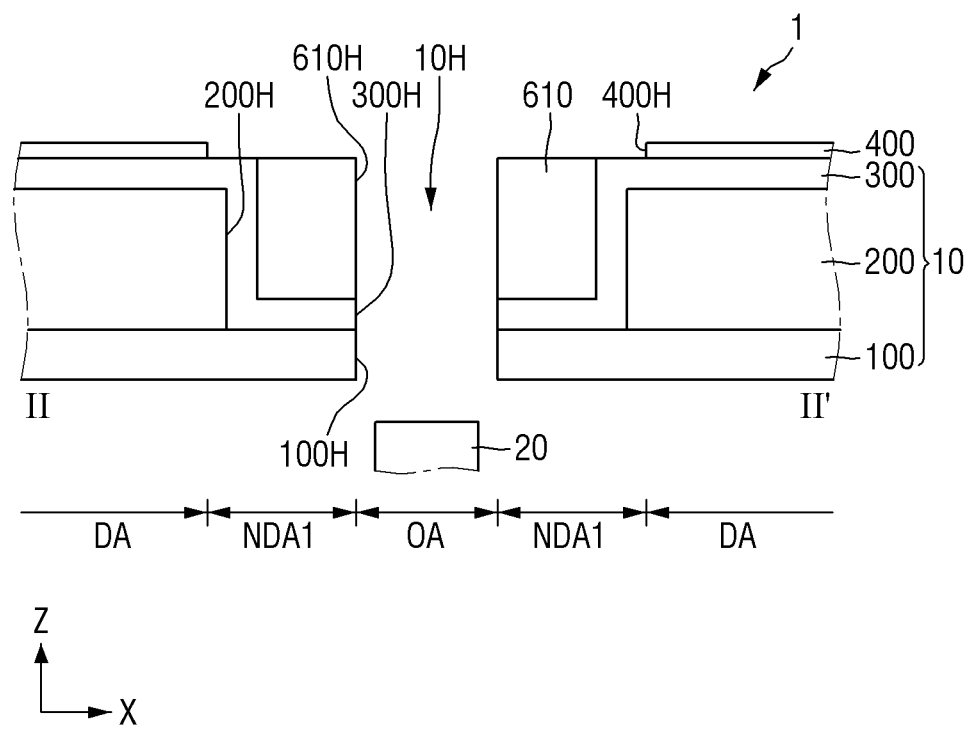
FIGS. 2A through 2C are schematic cross-sectional views of the display device of FIG. 1.
Figure 2B:
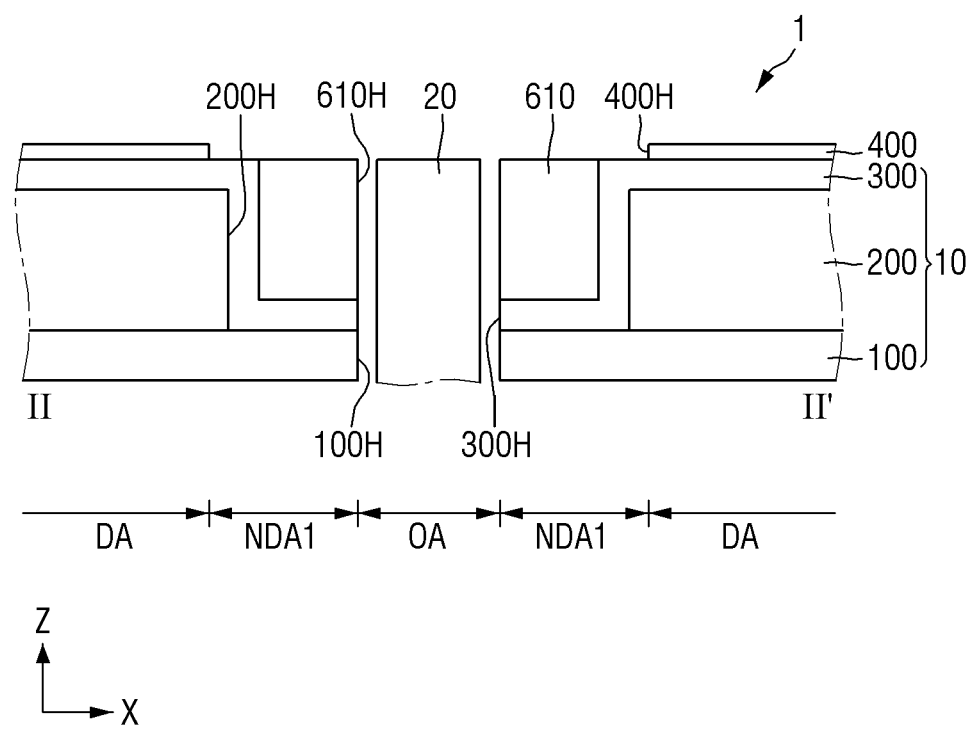
Figure 2C:
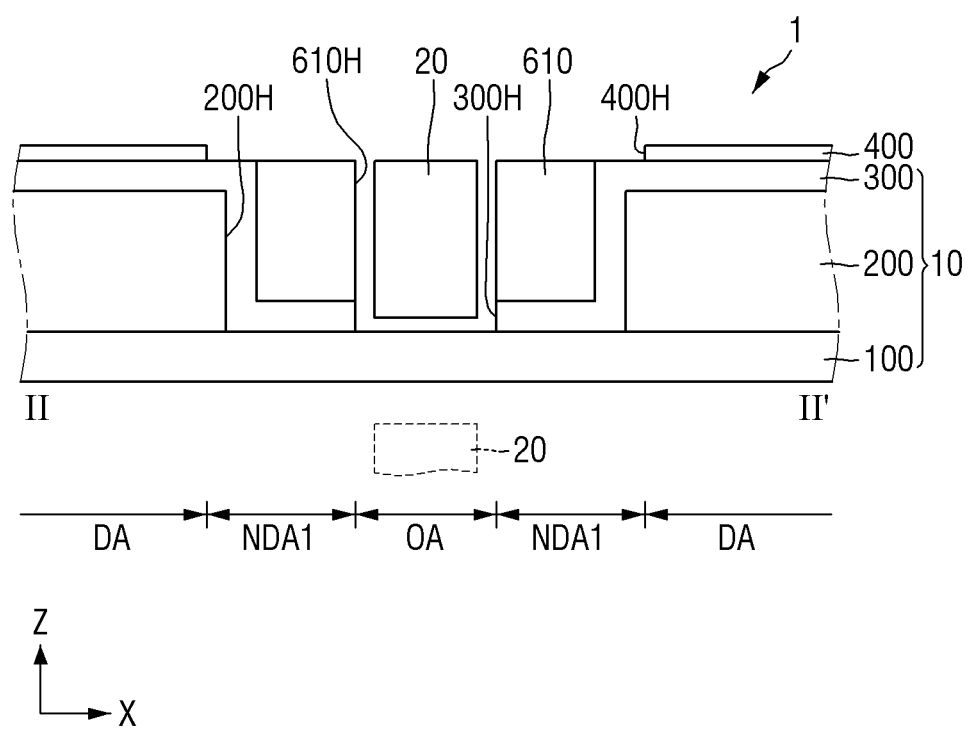

FIGS. 2A through 2C are schematic cross-sectional views, taken along line II-II' of FIG. 1, of the display device of FIG. 1.

Referring to FIG. 2A, the display device 1 may include a display panel 10 and a component 20, which may correspond to the opening area OA of the display panel 10.

The display panel 10 may include a substrate 100, a display element layer 200, which may be disposed on the substrate 100 and include display elements, a thin-film encapsulation layer 300, which may be an encapsulation member that may cover the display element layer 200, and an input sensing layer 400, which may sense touch input. Although not specifically illustrated, a polarizer, a retarder, color filters, an antireflection member (such as a black matrix), and a transparent window may be further disposed in the input sensing layer 400.

The substrate 100 may include a polymer resin. The substrate 100, which may include a polymer resin, may be more flexible than a glass substrate. For example, the substrate 100 may include a transparent polymer resin. The substrate 100 may further include, as a barrier layer for preventing the infiltration of external foreign materials, a single inorganic layer or multiple inorganic layers that may include an inorganic material such as silicon nitride (SiNx) and/or silicon oxide (SiOx).

The display element layer 200 may include display elements such as, for example, organic light-emitting diodes (OLEDs), which may be disposed in the display area DA. Although not specifically illustrated, the display element layer 200 may further include thin-film transistors (TFTs), storage capacitors Cst, and wires, which may be electrically connected to the display elements.

The thin-film encapsulation layer 300 may cover the display element layer 200 and may thus prevent any external moisture or pollutants from infiltrating into the display element layer 200. The thin-film encapsulation layer 300 may include at least one inorganic encapsulation layer and at least one organic encapsulation layer.

The thin-film encapsulation layer 300 may cover the display elements in the display area DA and may extend into the non-display area NDA. FIG. 2A illustrates that the thin-film encapsulation layer 300 extends into the first non-display area NDA1.

The input sensing layer 400 may be disposed in the display area DA. The input sensing layer 400 may acquire coordinate information regarding external input such as, for example, a touch event.

The input sensing layer 400 may include sensing electrodes (or touch electrodes) and signal lines electrically connected to the sensing electrodes.

The formation of the input sensing layer 400 may be performed readily after, or during, the formation of a planarization layer 610. Thus, an adhesive member may not be interposed between the input sensing layer 400 and the thin-film encapsulation layer 300.

The planarization layer 610 may be disposed in the first non-display area NDA1 The planarization layer 610 may include an organic insulating material. The planarization layer 610 may include photoresist (e.g., negative or positive photoresist). The planarization layer 610 and the organic encapsulation layer of the thin-film encapsulation layer 300 or an insulating layer of the input sensing layer 400 may include a same material. The planarization layer 610 may include various other organic materials.

As illustrated in FIG. 2A, the display panel 10 may include an opening 10H, which may correspond to the opening area OA and penetrate the display panel 10. The substrate 100, the display element layer 200, the thin-film encapsulation layer 300, the input sensing layer 400, and the planarization layer 610 may include first, second, third, fourth, and fifth openings 100H, 200H, 300H, 400H, and 610H, respectively, which correspond to the opening area OA.

The first opening 100H may be formed to penetrate the substrate 100, from the top and bottom surfaces of the substrate 100. The second opening 200H may be formed to penetrate the display element layer 200, from the uppermost layer to the lowermost layer of the display element layer 200. The third opening 300H may be formed to penetrate the thin-film encapsulation layer 300. The fourth opening 400H may be formed to penetrate the input sensing layer 400, from the uppermost layer to the lowermost layer of the input sensing layer 400. The fifth opening 610H may be formed to penetrate the planarization layer 610, from the top surface to the bottom surface of the planarization layer 610.

The opening area OA may be an area in which the component 20 may be disposed. The component 20 may be disposed below the display panel 10 to correspond to the opening area OA, as illustrated in FIG. 2A, or may be disposed in the opening 10H of the display panel 10 to overlap sides of the opening 10H, as illustrated in FIG. 2B.

The component 20 may include an electronic element. For example, the component 20 may be an electronic element that uses light or sound. For example, the electronic element may be a sensor (such as an infrared sensor) receiving and using light, a camera capturing an image by receiving light, a sensor measuring a distance, or recognizing a fingerprint, by outputting and sensing light or sound, a small lamp outputting light, or a speaker outputting sound. The electronic element may use light of various wavelength ranges such as visible light, infrared light, and ultraviolet light. In some embodiments, the opening area OA may be understood as being a transmission area that can transmit therethrough light and/or sound that may be output from the component 20 to the electronic element.

In another example, in a case where the display panel 10 may be used as a smartwatch or a dashboard for a vehicle, the component 20 may be a member including a clock hand or a needle indicating information (such as the speed of the vehicle). The component 20, which may be disposed at a location corresponding to the opening 10H of the display panel 10, as illustrated in FIG. 2A or 2B, may include elements associated with the functions of the display panel 10 or elements such as accessories that improve the aesthetic aspects of the display panel 10.

Referring to FIGS. 2A and 2B, the substrate 100 may include the first opening 100H, which may correspond to the opening area OA. As another example, referring to FIG. 2C, the substrate 100 may not include the first opening 100H. The component 20 may be disposed below the display panel 10, as indicated by dotted lines, or may be disposed in the opening 10H of the display panel 10, as indicated by solid lines. The component 20 disposed below the display panel 10 may be an electronic element that uses light, in which case, the light transmittance of the opening area OA of the display panel 10 may be about 50% or higher, about 70% or higher, about 75% or higher, about 80% or higher, about 85% or higher, or about 90% or higher.

As mentioned above with reference to FIGS. 2A through 2C, the substrate 100 may, or may not, include the first opening 100H. In a case where the substrate 100 includes the first opening 100H, the substrate 100 can be used in various manners, regardless of the type and the position of the component 20. Thus, the substrate 100 may include the first opening 100H. For convenience, the display panel 10 including the substrate 100 with the first opening 100H will hereinafter be described, but the disclosure may also be applicable to the display panel 100 of FIG. 2C.

Figure 3:
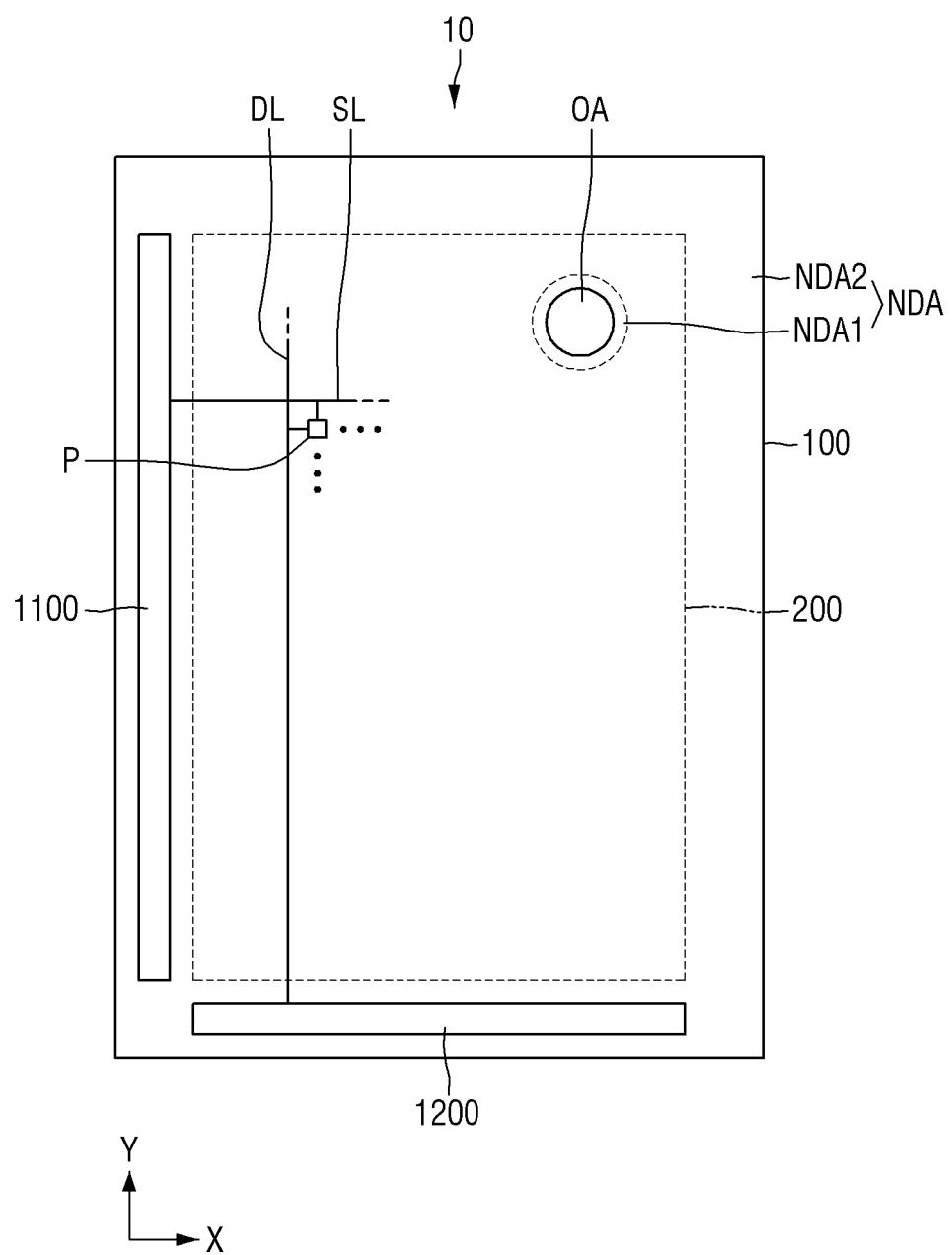
FIG. 3 is a schematic plan view of a display panel according to an embodiment of the disclosure.
Figure 4:
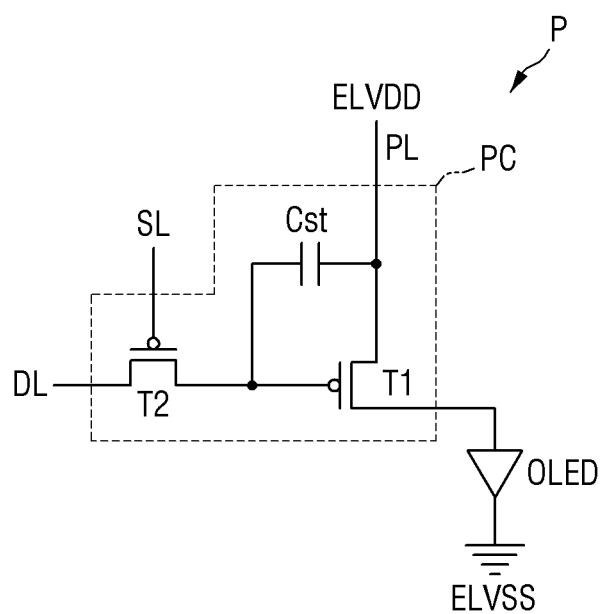
FIG. 4 is a schematic diagram of an equivalent circuit of a pixel of the display panel of FIG. 3.

FIG. 3 is a schematic plan view of a display panel according to an embodiment of the disclosure, and FIG. 4 is a schematic diagram of an equivalent circuit of a pixel of the display panel of FIG. 3.

Referring to FIG. 3, the display panel 10 may include the display area DA and the first and second non-display areas NDA1 and NDA2. Part of the display panel 10 illustrated in FIG. 3 may be understood as being the substrate 100. For example, the substrate 100 may be understood as including the opening area OA, the display area DA, and the first and second non-display areas NDA1 and NDA2.

The display panel 10 may include pixels P, which may be disposed in the display area DA.

Each of the pixels P may include a display element such as, for example, an OLED, and may thus emit red, green, blue, or white light via the OLED.

Referring to FIG. 4, each of the pixels P may include a pixel circuit PC and an OLED "OLED", which may be electrically connected to the pixel circuit PC. The pixel circuit PC may include a first TFT T1, a second TFT T2, and a storage capacitor Cst.

The second TFT T2, which may be a switching TFT, may be electrically connected to a scan line SL and a data line DL and transmit a data voltage input thereto from the data line DL to the first TFT T1 in accordance with a switching voltage input thereto from the scan line SL.

The storage capacitor Cst may be electrically connected to the second TFT T2 and a driving voltage line PL and store a voltage corresponding to the difference between the voltage received from the second TFT T2 and a first power supply voltage ELVDD supplied to the driving voltage line PL.

The first TFT T1, which may be a driving TFT, may be electrically connected to the driving voltage line PL and the storage capacitor Cst and may control a driving current that flows in the OLED "OLED" from the driving voltage line PL in accordance with the voltage stored in the storage capacitor Cst. The OLED "OLED" may emit light with a luminance due to the driving current. A counter electrode (e.g., the cathode) of the OLED "OLED" may be supplied with a second power supply voltage ELVSS.

FIG. 4 illustrates that the pixel circuit PC includes two TFTs and one storage capacitor, but the disclosure is not limited thereto.

The numbers of TFTs and storage capacitors may vary depending on the design of the pixel circuit PC.

Referring again to FIG. 3, the first non-display area NDA1 may surround the opening area OA. The first non-display area NDA1 may be an area where display elements such as OLEDs may not be disposed. In the first non-display area NDA1, wires disposed near the opening area OA may pass by, or grooves G that will be described later may be provided. Example wires include signal lines providing signals to the pixels P. In the second non-display area NDA2, a scan driver 1100, a data driver 1200, and main power supply wires (not illustrated) may be disposed. The scan driver 1100 may provide scan signals to the pixels P. The data driver 1200 may provide data signals to the pixels P. The main power supply wires may provide first and second power supply voltages. As another example, the data driver 1200 may be disposed on a flexible printed circuit board (FPCB), which may be electrically connected to pads provided at one side of the display panel 10.

Figure 5:
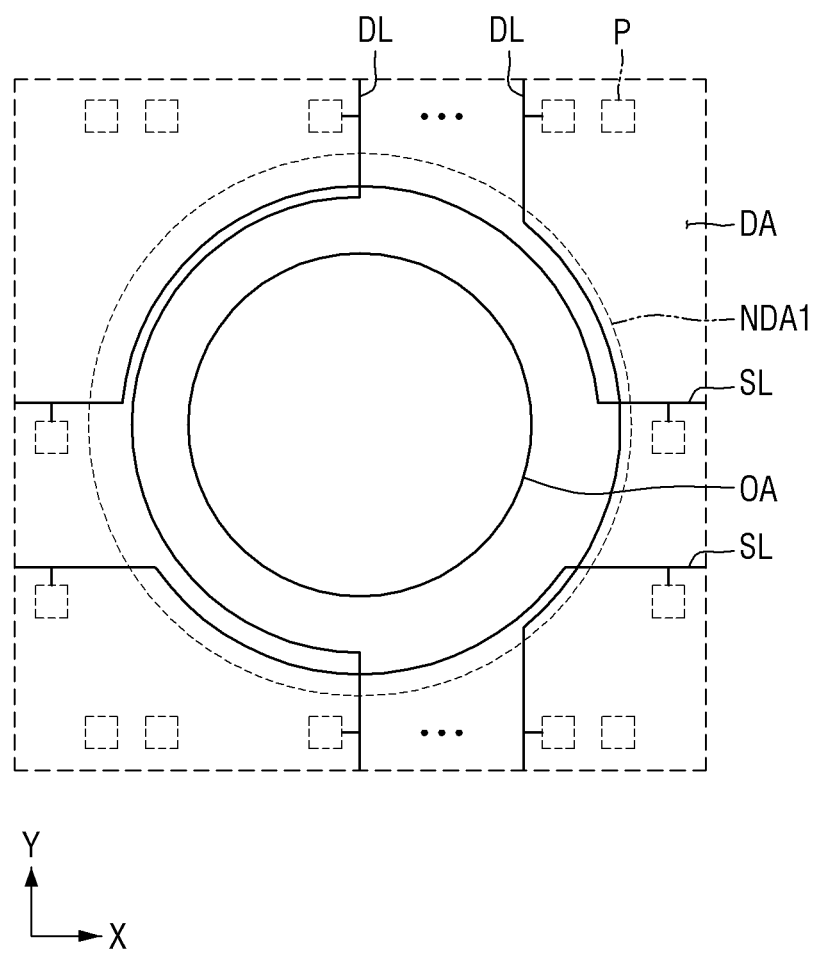
FIG. 5 is a schematic plan view illustrating wires (e.g., signal lines) disposed in an area of the display panel of FIG. 3.

FIG. 5 is a schematic plan view illustrating part of the display panel of FIG. 3, particularly, wires (e.g., signal lines) that may be disposed in the first non-display area of the display panel of FIG. 3.

Referring to FIG. 5, the pixels P may be disposed in the display area DA, around the opening area OA, and the first non-display area NDA1 may be disposed between the opening area OA and the display area DA.

The pixels P may be disposed to be spaced apart from the center of the opening area OA. The pixels P may be spaced apart vertically or horizontally from the center of the opening area OA.

Among signal lines that may provide signals to the pixels P, the signal lines adjacent to the opening area OA may bypass the opening area OA. To provide data signals to the pixels P disposed vertically apart from the opening area OA, some of data lines DL that pass through the display area DA may extend in a Y-axis direction, but may bypass the opening OA by extending in the first non-display area NDA1 along the circumference of the opening area OA.

To provide scan signals to the pixels P disposed horizontally apart from the opening area OA, some scan lines SL that pass through the display area DA may extend an X-axis direction, but may bypass the opening OA by extending in the first non-display area NDA1 along the circumference of the opening area OA.

Figure 6:
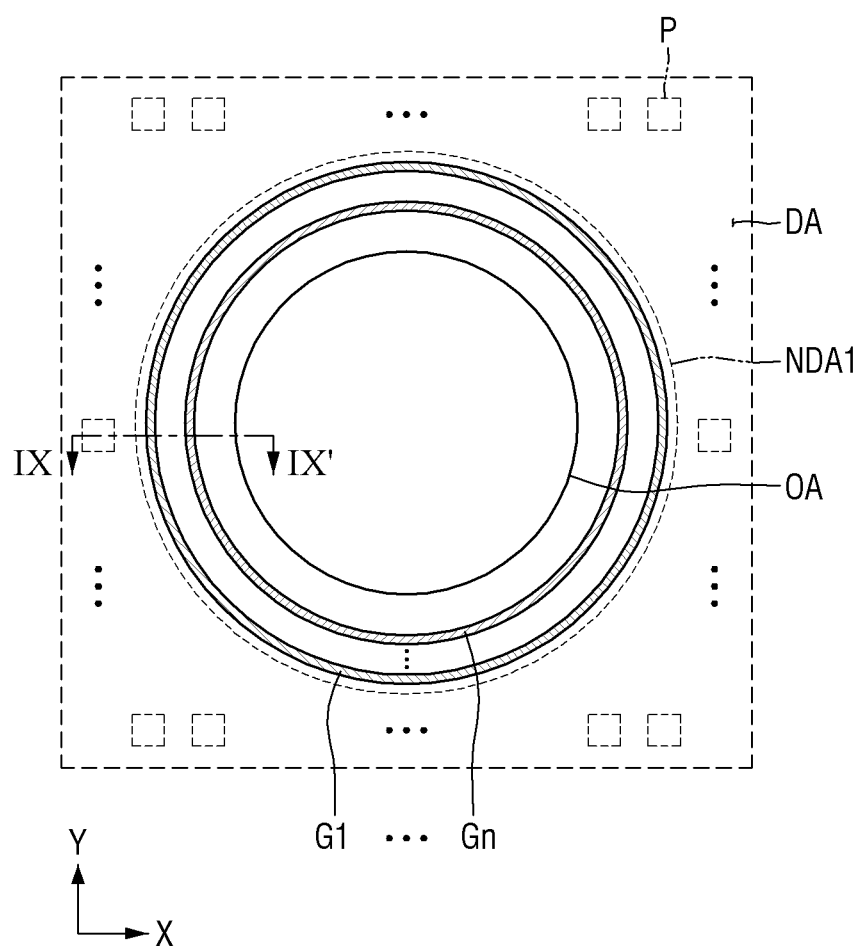
FIG. 6 is a schematic plan view illustrating grooves disposed in a non-display area of the display panel of FIG. 3.

FIG. 6 is a schematic plan view illustrating part of the display panel of FIG. 3, particularly, grooves G that may be disposed in the first non-display area of the display panel of FIG. 3.

Referring to FIG. 6, grooves G may be disposed between the opening area OA and the display area DA. Specifically, FIG. 6 illustrates that first through n-th grooves G1 through Gn may be disposed between the opening area OA and the display area DA.

The first through n-th grooves G1 through Gn may be in the first non-display area NDA in the shape of rings that surround the opening area OA. The diameters of the first through n-th grooves G1 through Gn may be greater than the diameter of the opening area OA, and the first through n-th grooves G1 through Gn may be spaced apart from one another. For example, the diameter of the first groove G1 may be greater than the diameter of the n-th groove Gn. For convenience, the first through n-th grooves G1 through Gn may be illustrated as being in the shape of rings, but may be discontinued in regions where the scan lines SL and the data lines DL extend from the display area DA to the first non-display area NDA1.

As illustrated in FIG. 6, the first through n-th grooves G1 through Gn may have the same width.

Referring to FIGS. 5 and 6, the first through n-th grooves G1 through Gn may be disposed closer than the opening area OA to signal lines bypassing the opening area OA, e.g., the data lines DL and the scan lines SL.

The first through n-th grooves G1 through Gn may be formed with numbers of scan lines SL and data lines DL interposed therebetween. In order to prevent an excessive increase in the size of the first non-display area NDA1, only an appropriate number of grooves G, for example, five grooves G, may be formed, instead of forming a groove G between every bypass signal line (e.g., the scan lines SL and the data lines DL), to control the flow of a monomer (or an organic encapsulation layer) and to maximize a water repellent effect.

However, the number of grooves G is not particularly limited, and as another example, grooves G may be formed between every scan line SL and between every data line DL. Also, the number of grooves G may increase or decrease in proportion to the size of the opening area OA in the display area DA.

Figure 7:
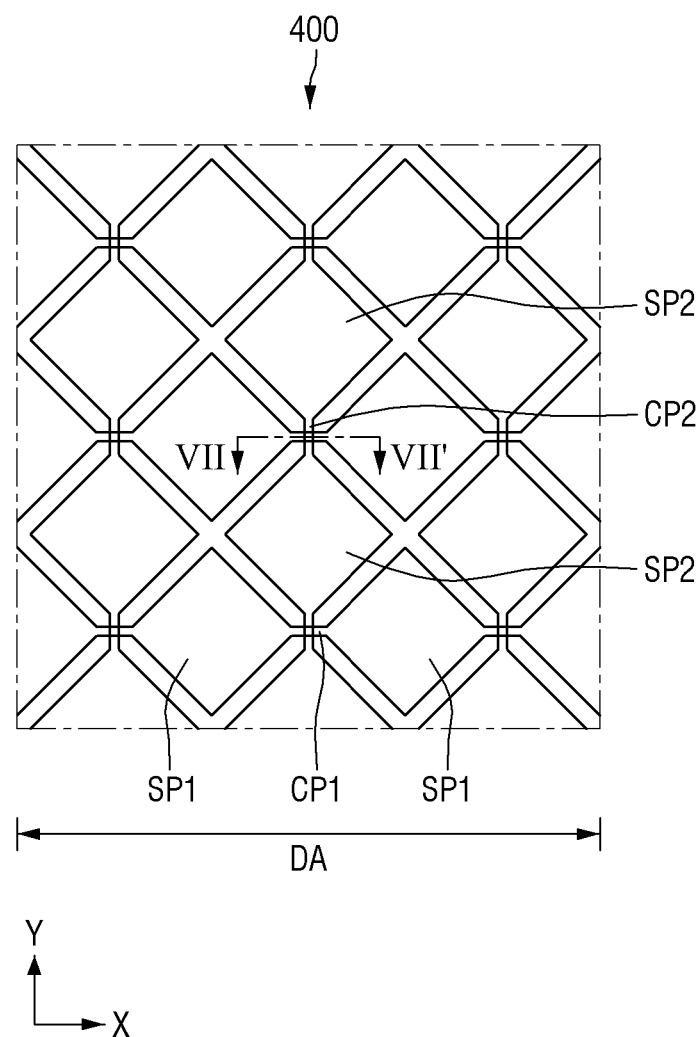
FIG. 7 is a schematic plan view illustrating an input sensing layer of the display panel of FIG. 3.

FIG. 7 is a schematic plan view illustrating an input sensing layer of the display panel of FIG. 3. For convenience, FIG. 7 illustrates part of the input sensing layer of the display panel of FIG. 3, particularly, part of the input sensing layer disposed in the display area DA of FIG. 3.

Referring to FIG. 7, the input sensing layer 400 may include first sensing electrodes SP1 and second sensing electrodes SP2, and the first sensing electrodes SP1 and the second sensing electrodes SP2 may be disposed in the display area DA. The first sensing electrodes SP1 may be arranged along the X-axis direction, and the second sensing electrodes SP2 may be arranged along the Y-axis direction to intersect the first sensing electrodes SP1. The first sensing electrodes SP1 may perpendicularly intersect the second sensing electrodes SP2.

The first sensing electrodes SP1 may be disposed to have their corners adjacent to the second sensing electrodes SP2, and vice versa. The first sensing electrodes SP1 may be electrically connected to one another via first connecting electrodes CP1, and the second sensing electrodes SP2 may be electrically connected to one another via second connecting electrodes CP2.

Figure 8A:
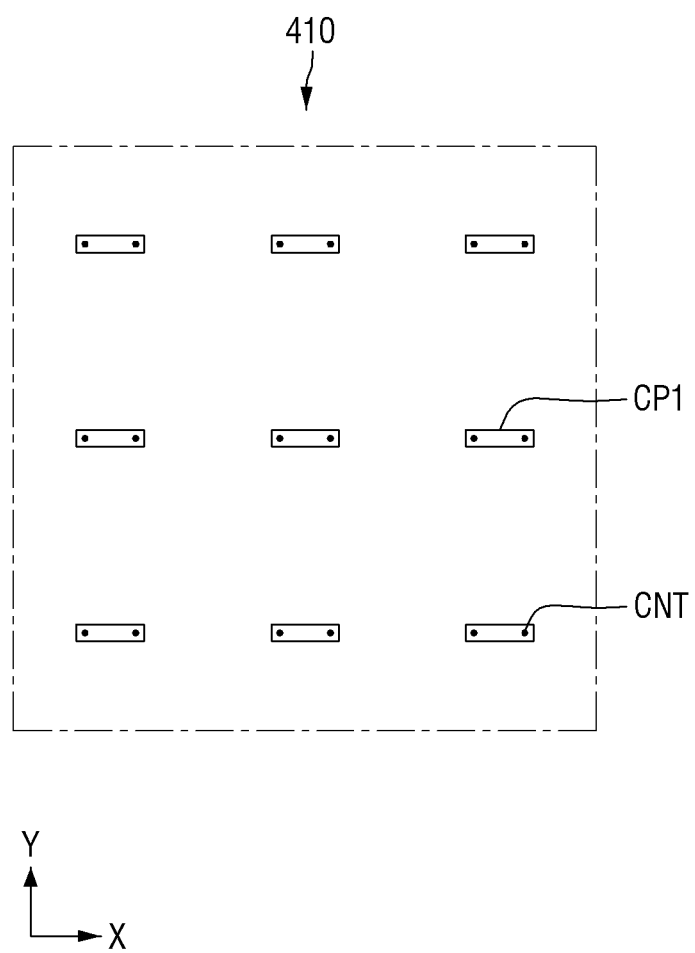
FIGS. 8A and 8B are schematic plan views illustrating first and second conductive layers, respectively, of the input sensing layer of FIG. 7.
Figure 8B:
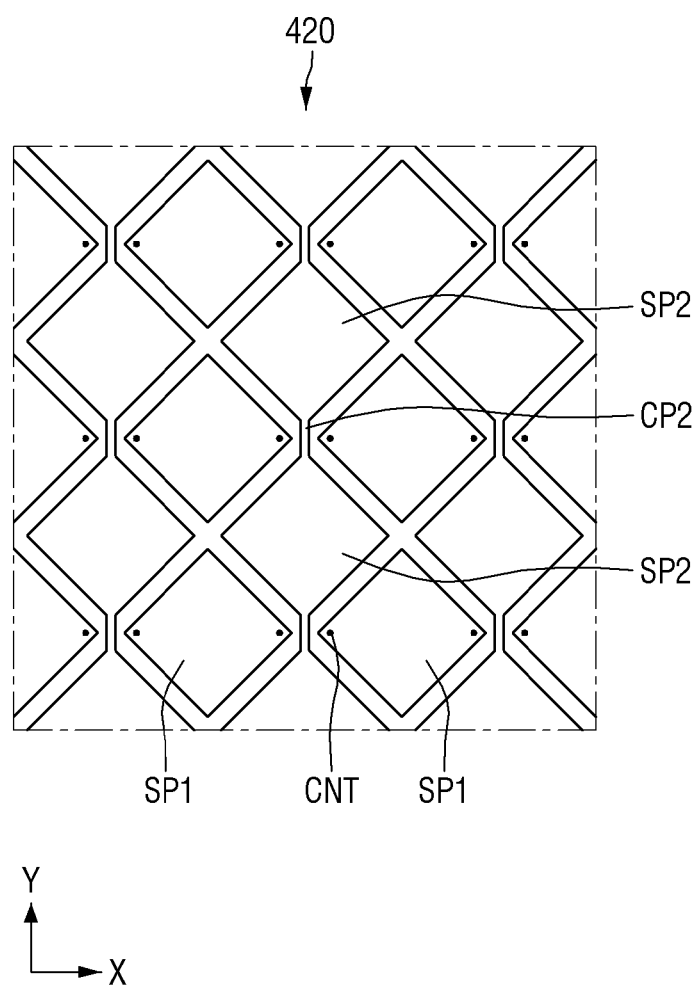
Figure 8C:
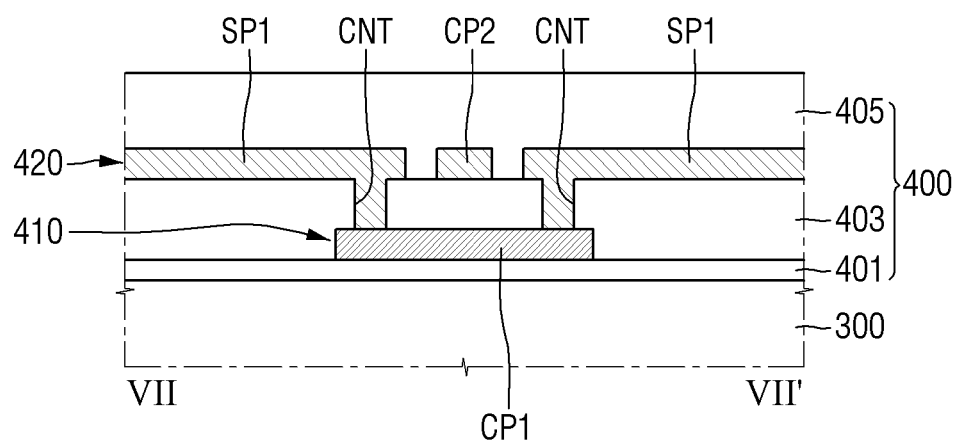
FIG. 8C is a schematic cross-sectional view taken along line VII-VII' of FIG. 7.

FIGS. 8A and 8B are schematic plan views illustrating first and second conductive layers, respectively, of the input sensing layer of FIG. 7, and FIG. 8C is a schematic cross-sectional view taken along line VII-VII' of FIG. 7.

Referring to FIGS. 8A and 8B, the first sensing electrodes SP1 and the second sensing electrodes SP2 may be disposed on a same layer. A first conductive layer 410 may include the first connecting electrodes CP1, as illustrated in FIG. 8A, and a second conductive layer 420 may include the first sensing electrodes SP1, the second sensing electrodes SP2, and the second connecting electrodes CP2, as illustrated in FIG. 8B.

The second sensing electrodes SP2 may be electrically connected by the second connecting electrodes CP2. The second connecting electrodes CP2 and the second sensing electrodes SP2 may be disposed in a same layer. The first sensing electrodes SP1 may be arranged along the X-axis direction, but may be electrically connected by the first connecting electrodes CP1, which may be disposed in a different layer from the first sensing electrodes SP1.

Referring to FIG. 8C, a second insulating layer 403 may be interposed between the first and second conductive layers 410 and 420. The first sensing electrodes SP1, which may be disposed in the second conductive layer 420, may be electrically connected to the first connecting electrodes CP1, which may be disposed in the first conductive layer 410, via contact holes CNT in the second insulating layer 403. The second conductive layer 420 may be covered by a third insulating layer 405, and a first insulating layer 401 may be disposed below the first conductive layer 410. The first and second insulating layers 401 and 403 may be inorganic insulating layers such as silicon nitride layers, and the third insulating layer 405 may be an organic insulating layer. FIG. 8C illustrates that the first insulating layer 401 is interposed between the thin-film encapsulation layer 300 and the first conductive layer 410. However, as another example, the first insulating layer 401 may not be provided, and the first conductive layer 410 may be disposed above (e.g., directly above) the thin-film encapsulation layer 300. As another example, the first and second insulating layers 401 and 403 may be organic insulating layers.

Figure 9:
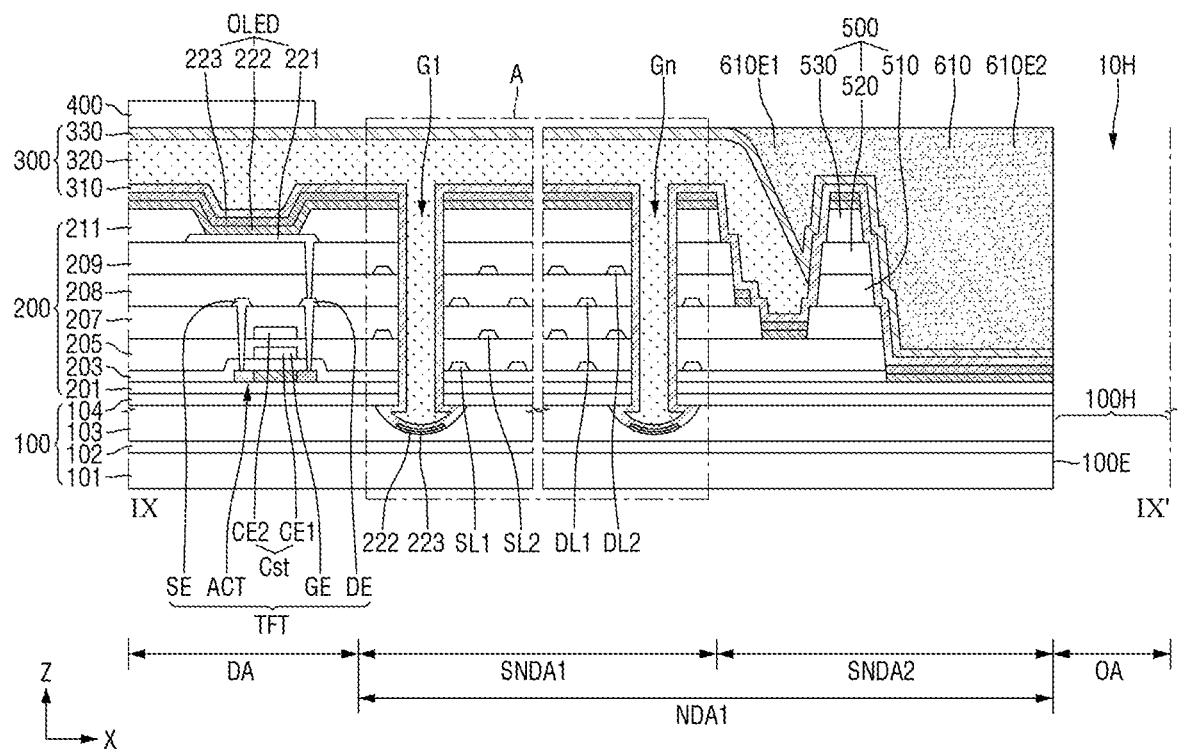
FIG. 9 is a schematic cross-sectional view taken along line IX-IX' of FIG. 6.
Figure 10:
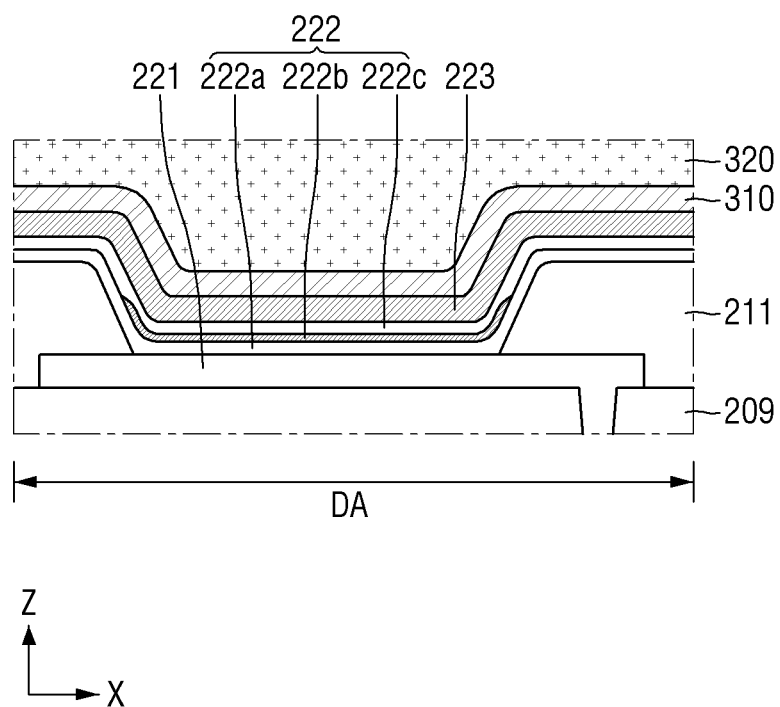
FIG. 10 is an enlarged schematic cross-sectional view illustrating an organic light-emitting diode (OLED) of FIG. 9.
Figure 11:
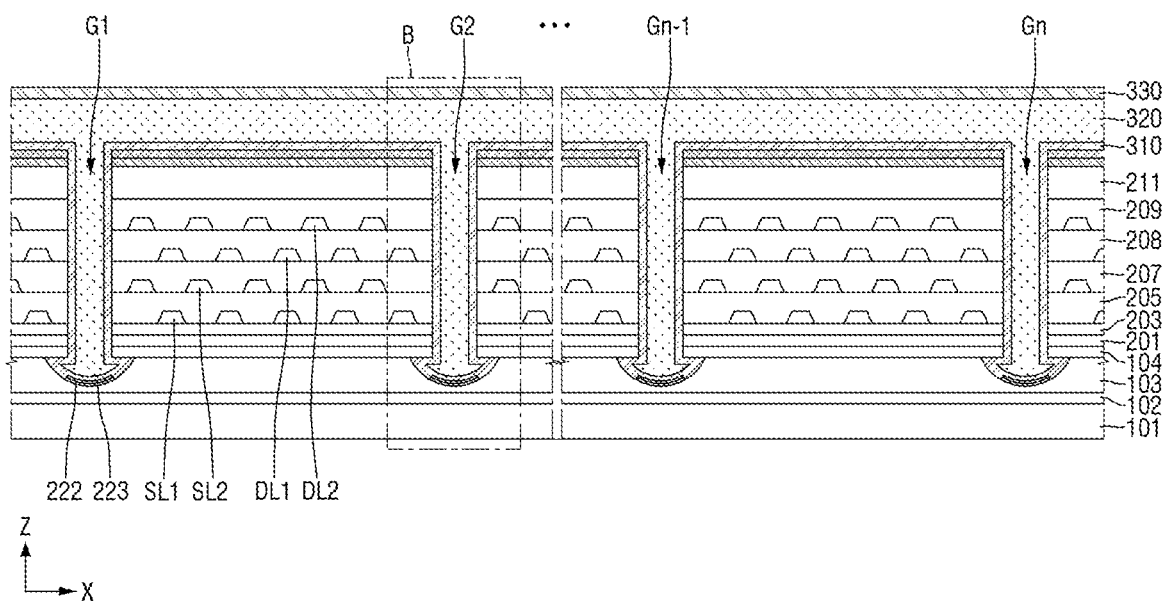
FIG. 11 is an enlarged schematic cross-sectional view illustrating an area A of FIG. 9.
Figure 12:
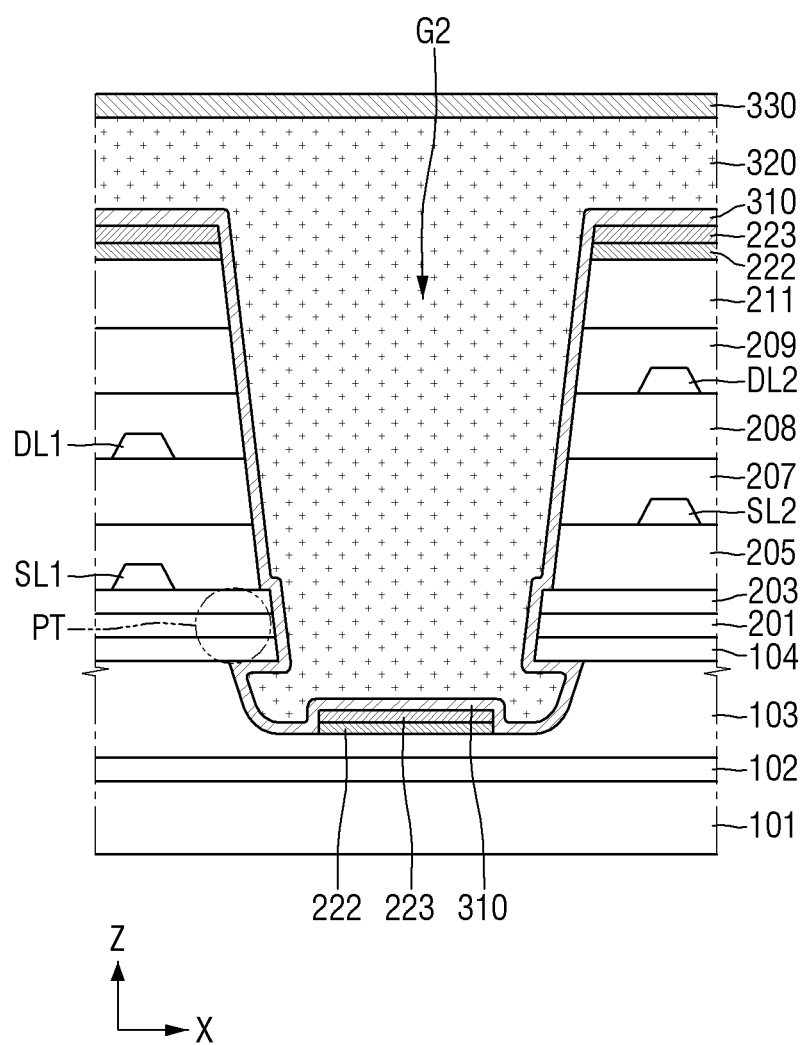
FIG. 12 is an enlarged schematic cross-sectional view illustrating an area B of FIG. 11.

FIG. 9 is a schematic cross-sectional view taken along line IX-IX' of FIG. 6, and FIG. 10 is an enlarged schematic cross-sectional view illustrating an OLED of FIG. 9. FIG. 11 is an enlarged schematic cross-sectional view illustrating an area A of FIG. 9. FIG. 12 is an enlarged schematic cross-sectional view illustrating an area B of FIG. 11.

Specifically, FIGS. 9 through 12 illustrate the opening area OA, the first non-display area NDA1, and the display area DA. Referring to FIGS. 9 through 12, the substrate 100 may include the first opening 100H, which may correspond to the opening area OA. The opening area OA will hereinafter be understood as referring to the opening 10H of the display panel 10 or the first opening 100H of the substrate 100. The display area DA of FIG. 9 will hereinafter be described.

The substrate 100 may include a polymer resin. The substrate 100 may include one or more base layers, which include a polymer resin, and one or more inorganic layers. For example, the substrate 100 may include a first base layer 101, a first inorganic layer 102, a second base layer 103, and a second inorganic layer 104, which may be sequentially stacked on each other on the substrate 100.

The first and second base layers 101 and 103 may include a polymer resin.

For example, the first and second base layers 101 and 103 may include a polymer resin such as polyethersulphone (PES), polyacrylate (PAR), polyetherimide (PEI), polyethylene naphthalate (PEN), polyethylene terephthalate (PET), polyphenylene sulfide (PPS), polyallylate, Polyimide (PI), polycarbonate (PC), cellulose triacetate (TAC), cellulose acetate propionate (CAP), or a combination thereof, and the polymer resin may be transparent.

The first and second inorganic layers 102 and 104, which may be barrier layers for preventing the penetration of external foreign materials, may be single- or multilayer films including an inorganic material such as silicon nitride (SiNx) and/or silicon oxide (SiOx).

A buffer layer 201, which may be formed to prevent impurities from infiltrating into a semiconductor layer Act of a TFT "TFT", may be disposed on the substrate 100. The buffer layer 201 may include an inorganic insulating material such as silicon nitride and/or silicon oxide and may be a single- or multilayer film. In some embodiments, the second inorganic layer 104 of the substrate 100 may be understood as being part of a multilayer buffer layer 201.

A pixel circuit PC, which may include the TFT "TFT" and a storage capacitor Cst, may be disposed on the buffer layer 201. The TFT "TFT" may include a semiconductor layer Act, a gate electrode GE, a source electrode SE, and a drain electrode DE. The TFT "TFT" of FIG. 9 may correspond to the driving TFT of FIG. 4. The TFT "TFT" of FIG. 9 is illustrated as being of a top gate type in which the gate electrode GE may be disposed above the semiconductor layer ACT with a gate insulating layer 203 interposed therebetween, but as another example, the TFT "TFT" of FIG. 9 may be of a bottom gate type.

The semiconductor layer ACT may include polysilicon. As another example, the semiconductor layer Act may include amorphous silicon, an oxide semiconductor, an organic semiconductor, or a combination thereof. The gate electrode GE may include a low-resistance metallic material.

The gate electrode GE may include a conductive material that includes molybdenum (Mo), aluminum (Al), copper (Cu), titanium (Ti), or a combination thereof, and may be formed as a multi- or single-layer film.

The gate insulating layer 203 may be interposed between the semiconductor layer Act and the gate electrode GE and may include an inorganic insulating material such as silicon oxide, silicon nitride, silicon oxynitride, aluminum oxide, titanium oxide, tantalum oxide, hafnium oxide, or a combination thereof. The gate insulating layer 203 may be formed as a multi- or single-layer film.

The source electrode SE and the drain electrode DE may include a material with excellent conductivity.

The source electrode SE and the drain electrode DE may include a conductive material that includes Mo, Al, Cu, Ti, or a combination thereof, and may be formed as a multi- or single-layer film. In one embodiment, the source electrode SE and the drain electrode DE may be formed as multilayer films of Ti/Al/Ti.

The storage capacitor Cst may include a lower electrode CE1 and an upper electrode CE2, which may overlap each other with a first interlayer insulating layer 205 interposed therebetween. The storage capacitor Cst may overlap the TFT "TFT". FIG. 9 illustrates the gate electrode GE of the TFT "TFT" as being the lower electrode CE1 of the storage capacitor Cst. As another example, the storage capacitor Cst may not overlap the TFT "TFT". The storage capacitor Cst may be covered by a second interlayer insulating layer 207.

The first and second interlayer insulating layers 205 and 207 may include an inorganic insulating material such as silicon oxide, silicon nitride, silicon oxynitride, aluminum oxide, titanium oxide, tantalum oxide, hafnium oxide, or a combination thereof. The first and second interlayer insulating layers 205 and 207 may be single- or multilayer films.

The pixel circuit PC, which may include the TFT "TFT" and the storage capacitor Cst, may be covered by first and second interlayer organic insulating layers 208 and 209. The first and second organic insulating layers 208 and 209 may be planarization insulating layers.

The first and second organic insulating layers 208 and 209 may include an organic insulating material such as a general-purpose polymer such as polymethylmethacrylate (PMMA) or polystyrene (PS), a polymer derivative having a phenolic group, an acrylic polymer, an imide polymer, an aryl ether polymer, an amide polymer, a fluorine polymer, a p-xylene polymer, a vinyl alcohol polymer, or a blend thereof. In one embodiment, the first and second organic insulating layers 208 and 209 may include polyimide.

An OLED "OLED" may be disposed on the second organic insulating layer 209.

A pixel electrode 221 of the OLED "OLED" may be disposed on the second organic insulating layer 209 and may be electrically connected to the pixel circuit PC via contact holes in the first and second organic insulating layers 208 and 209.

The pixel electrode 221 may include a conductive oxide such as indium tin oxide (ITO), indium zinc oxide (IZO), zinc oxide (ZiO), indium oxide ($In_2O_3$), indium gallium oxide (IGO), aluminum zinc oxide (AZO), or a combination thereof. As another example, the pixel electrode 221 may include a reflective film that contains silver (Ag), magnesium (Mg), aluminum (Al), platinum (Pt), palladium (Pd), gold (Au), nickel (Ni), neodymium (Nd), iridium (Ir), chromium (Cr), or a compound thereof. As another example, the pixel electrode 221 may further include a film of ITO, IZO, ZnO, or $In_2O_3$ above/below the reflective film.

A pixel-defining layer 211 may include an opening that exposes the top surface of the pixel electrode 221, and covers the edges of the pixel electrode 221. The pixel-defining layer 211 may include an organic insulating material. As another example, the pixel-defining layer 211 may include an inorganic insulating material or both organic and inorganic insulating materials.

A middle layer 222 may include a light-emitting layer 222b. The light-emitting layer 222b may include a polymer or low-molecular organic material that emits light of a color. In one embodiment, referring to FIG. 10, the middle layer 222 may include a first functional layer 222a, which may be disposed below the light-emitting layer 222b, and/or a second functional layer 222c, which may be disposed above the light-emitting layer 222b.

The first functional layer 222a may be a single- or multilayer film. For example, in a case where the first functional layer 222a may be formed of a polymer material, the first functional layer 222a may be formed as a hole transport layer (HTL) having a single layer structure, using poly-(3,4)-ethylene-dihydroxy thiophene (PEDOT) or polyaniline (PANI).

In a case where the first functional layer 222a may be formed of a low-molecular material, the first functional layer 222a may include a hole injection layer (HIL) and a hole transport layer (HTL).

The second functional layer 222c may not be provided. For example, in a case where the first functional layer 222a and the light-emitting layer 222b may be formed of a polymer material, the second functional layer 222c may be formed to improve the characteristics of the OLED "OLED".

The second functional layer 222c may be a single- or multilayer film. The second functional layer 222c may include an electron transport layer (ETL) and/or an electron injection layer (EIL).

Some of the layers of the middle layer 222, for example, the first and second functional layers 222a and 222b, may be disposed not only in the display area DA, but also in the first non-display area NDA1, and may be disconnected by the first through n-th grooves G1 through Gn.

A counter electrode 223 may be disposed to face the pixel electrode 221 with the middle layer 222 interposed therebetween. The counter electrode 223 may be formed of a conductive material having a low work function. For example, the counter electrode 223 may include a transparent layer or a semi-transparent layer that includes Ag, Mg, Al, Pt, Pd, Au, Ni, Nd, Ir, Cr, lithium (Li), calcium (Ca) or an alloy thereof. As another example, the counter electrode 223 may further include a layer of ITO, IZO, ZnO, or $In_2O_3$ on the transparent layer or the semi-transparent layer.

The OLED "OLED" may be covered by the thin-film encapsulation layer 300 and may be protected against external impurities or moisture. The thin-film encapsulation layer 300 may include at least one organic encapsulation layer and at least one inorganic encapsulation layer. FIG. 9 illustrates that the thin-film encapsulation layer 300 includes first and second inorganic encapsulation layers 310 and 330 and an organic encapsulation layer 320, which may be interposed between the first and second inorganic encapsulation layers 310 and 330. The numbers of, and the stacking order between, organic encapsulation layers and inorganic encapsulation layers in the thin-film encapsulation layer 300 may vary.

The first and second inorganic encapsulation layers 310 and 330 may include at least one inorganic insulating material such as aluminum oxide, titanium oxide, tantalum oxide, hafnium oxide, zinc oxide, silicon oxide, silicon nitride, silicon oxynitride, or a combination thereof, and may be formed by chemical vapor deposition (CVD). The organic encapsulation layer 320 may include a polymer material. Examples of the polymer material include an acrylic resin, an epoxy resin, polyimide, and polyethylene.

The input sensing layer 400 may be disposed in the display area DA. The input sensing layer 400 may acquire coordinate information regarding external input such as, for example, a touch event. The input sensing layer 400 may be formed on (e.g., directly on) the substrate 100 where the thin-film encapsulation layer 300 may be formed, and may be in contact with the thin-film encapsulation layer 300. Thus, a member such as an adhesive member may not be provided between the input sensing layer 400 and the thin-film encapsulation layer 300. The input sensing layer 400 may include sensing electrodes (or touch electrodes) or signal lines electrically connected to the sensing electrodes. As illustrated in FIGS. 7 and 8, the input sensing layer 400 includes the first and second conductive layers 410 and 420 where the sensing electrodes may be disposed. The input sensing layer 400 may further include insulating layers disposed above or below the first and second conductive layers 410 and 420, i.e., the first, second, and third insulating layers 401, 403, and 405.

The first non-display area NDA1 of FIG. 9 will hereinafter be described.

Referring to FIG. 9, the first non-display area NDA1 may include a first sub-non-display area SNDA1, which may be relatively distant from the opening area OA, and a second sub-non-display area SNDA2, which may be relatively close to the opening area OA.

The first sub-non-display area SNDA1 may be a region that may be passed through by signal lines. Scan lines (SL1 and SL2) and data lines (DL1 and DL2) may correspond to the scan lines SL and the data lines DL, respectively, that bypass the opening area OA of FIG. 5. For example, the first sub-non-display area SNDA1 may be a wire bypass area that may be passed through by signal lines.

The scan lines (SL1 and SL2) may be alternately arranged with an insulating layer interposed therebetween, as illustrated in FIG. 11. For example, first scan lines SL1 may be disposed on the gate insulating layer 203 at intervals of a distance in the X-axis direction, and second scan lines SL2 may be disposed on the first interlayer insulating layer 205 at intervals of a distance in the X-axis direction. The first scan lines SL1 and the second scan lines SL2 may be alternately arranged not to overlap each other in the Z-axis direction with the first interlayer insulating layer 205 interposed therebetween.

In a case where the scan lines (SL1 and SL2) may be disposed above and below an insulating layer (e.g., the first interlayer insulating layer 205), the gap (or pitch) between pairs of adjacent scan lines (SL1 and SL2) can be reduced, and the width of the first non-display area NDA1 can be reduced.

The data lines DL may be alternately arranged with an insulating layer interposed therebetween, as illustrated in FIG. 11. For example, first data lines DL1 may be disposed on the second interlayer insulating layer 207 at intervals of a distance in the X-axis direction, and second data lines DL2 may be disposed on the first organic insulating layer 208 at intervals of a distance in the X-axis direction. The first data lines DL1 and the second data lines DL2 may be alternately arranged not to overlap each other in the Z-axis direction with the first organic insulating layer 208 interposed therebetween.

In a case where the data lines (DL1 and DL2) may be disposed above and below an insulating layer (e.g., the first organic insulating layer 208), the gap (or pitch) between pairs of adjacent data lines (DL1 and DL2) can be reduced, and the width of the first non-display area NDA1 can be reduced.

As another example, the scan lines (SL1 and SL2) and the data lines (DL1 and DL2) may be disposed on the same insulating layer.

The first through n-th grooves G1 through Gn may be formed in the first sub-non-display area SNDA1, particularly, in one region between the scan lines (SL1 and SL2) and the data lines (DL1 and DL2).

For example, as illustrated in FIG. 11, the first scan lines SL1 and the first data lines DL1 may be disposed to overlap each other in the Z-axis direction (e.g., a thickness direction of the display device), and the second scan lines SL2 and the second data lines DL2 may be disposed to overlap each other in the Z-axis direction. Ten scan lines (SL1 and SL2) and ten data lines (DL1 and DL2) may be disposed between the first and second grooves G1 and G2. Ten scan lines (SL1 and SL2) and ten data lines (DL1 and DL2) may also be disposed between the (n−1)-th and n-th grooves Gn−1 and Gn.

Bypass wires (SL and DL) may be alternately arranged with insulating layers interposed therebetween, in each bypass region, so that a total of about 60 bypass wires may be provided in a clockwise or counterclockwise direction. One groove G may be formed for every ten bypass wires. For example, if there may be a total of about 60 bypass wires (SL and DL), a total of five grooves G, i.e., the first through fifth grooves G1 through G5, may be formed between the bypass wires (SL and DL).

Referring to FIG. 12, each of the first through n-th grooves G1 through Gn may have an undercut structure. The first through n-th grooves G1 through Gn may be formed in a multilayer film including inorganic layers and organic layers. For example, the first through n-th grooves G1 through Gn may be formed by removing parts of the substrate 100 that include layers.

The first through n-th grooves G1 through Gn may be formed by etching the second base layer 103 and the second inorganic layer 104 of the substrate 100, the buffer layer 201, and the gate insulating layer 203. FIG. 9 illustrates that the first through n-th grooves G1 through Gn may be formed by removing parts of the second base layer 103, the second inorganic layer 104, the buffer layer 201, and the gate insulating layer 203. In one embodiment, the first and second interlayer insulating layers 205 and 207, the first and second organic insulating layers 208 and 209, and the pixel-defining layer 211 may also be partially removed to form parts of the first through n-th grooves G1 through Gn.

Each of the first through n-th grooves G1 through Gn may have an undercut structure. Each of the first through n-th grooves G1 through Gn may have an undercut structure that may be wider in the second base layer 103 than in inorganic insulating layers, for example, in the second inorganic layer 104, the buffer layer 201, and the gate insulating layer 203 (see, e.g., area PT in FIG. 12). Due to the undercut structure of each of the first through n-th grooves G1 through Gn, some of the layers of the middle layer 222 (e.g., the first and second functional layers 222a and 222c) and the counter electrode 223 may be disconnected.

The first inorganic encapsulation layer 310 of the thin-film encapsulation layer 300 may cover the inner surfaces of the first through n-th grooves G1 through Gn. As illustrated in FIG. 12, the organic encapsulation layer 320 may cover the second groove G2 and may fill the second groove G2, on the first inorganic encapsulation layer 310.

The organic encapsulation layer 320 may be formed by applying a monomer on the substrate 100 and curing the monomer. In order to control the flow of the monomer and to secure the thickness of the monomer (or the organic encapsulation layer 320), a partition 500 may be provided near the n-th groove Gn.

The partition wall 500 may include an organic insulating material and may be a stack of, for example, first, second, and third sub-partition walls 510, 520, and 530. The first, second, and third sub-partition walls 510, 520, and 530 may be formed at the same time using a same material as the first and second organic insulating layers 208 and 209 and the pixel-defining layer 211.

The second inorganic encapsulation layer 330 may be disposed on the organic encapsulation layer 320.

The planarization layer 610 may be disposed on the second inorganic encapsulation layer 330, between the opening area OA and the partition wall 500.

The planarization layer 610 may be disposed in the second sub-non-display area SNDA2. As illustrated in FIG. 9, the space above the second inorganic encapsulation layer 330 may be filled with the planarization layer 610. The planarization layer 610 may increase the flatness of the display panel 10 near the opening area OA by covering part of the second sub-non-display area SNDA2 that may be not covered with the organic encapsulation layer 320. Thus, elements such as an antireflection member or a window can be prevented from being coupled improperly to, detached from, or lifted off from the display panel 10.

The planarization layer 610 may include an organic insulating material. The planarization layer 610 may include photoresist (e.g., negative photoresist or positive photoresist). As another example, the planarization layer 610 and the third insulating layer 405 of FIG. 8C may include a same material.

The planarization layer 610 may be disposed on the thin-film encapsulation layer 300. The planarization layer 610 may be spatially separated from the organic encapsulation layer 320 by the second inorganic encapsulation layer 330. For example, the planarization layer 610 may be disposed above the second inorganic encapsulation layer 330, and the organic encapsulation layer 320 may be disposed below the second inorganic encapsulation layer 330.

The organic encapsulation layer 320 and the planarization layer 610 may not be in direct contact with each other. The planarization layer 610 may have a thickness of about 5 μm or greater. Part of the planarization layer 610 may overlap the organic encapsulation layer 320. A first end 610E1 of the planarization layer 610 may extend over the organic encapsulation layer 320 to overlap the organic encapsulation layer 320. A second end 610E2 of the planarization layer 610 may face the opening area OA. The second end 610E2 of the planarization layer 610 may be positioned on the same line as end 100E of the substrate 100E.

Display devices according to other embodiments of the disclosure will hereinafter be described. Descriptions of elements or features that have already been described above will be omitted, or at least simplified, and display devices according to other embodiments of the disclosure will hereinafter be described, focusing on the differences with the display device 10.

Figure 13:
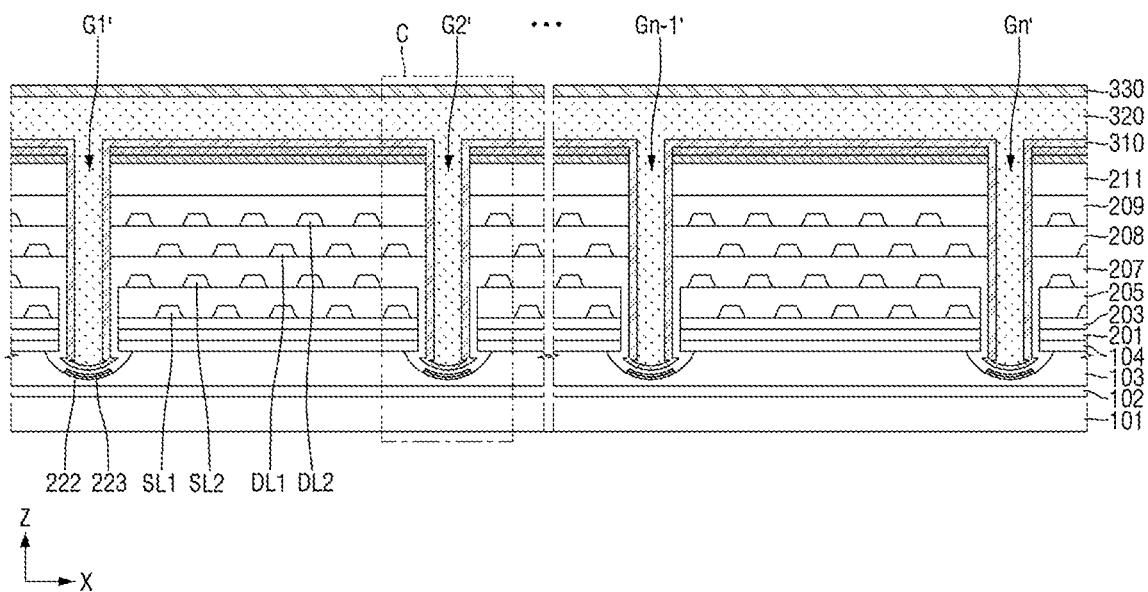
FIG. 13 is an enlarged schematic cross-sectional view illustrating an area A (of FIG. 9) of a display device according to another embodiment of the disclosure.
Figure 14:
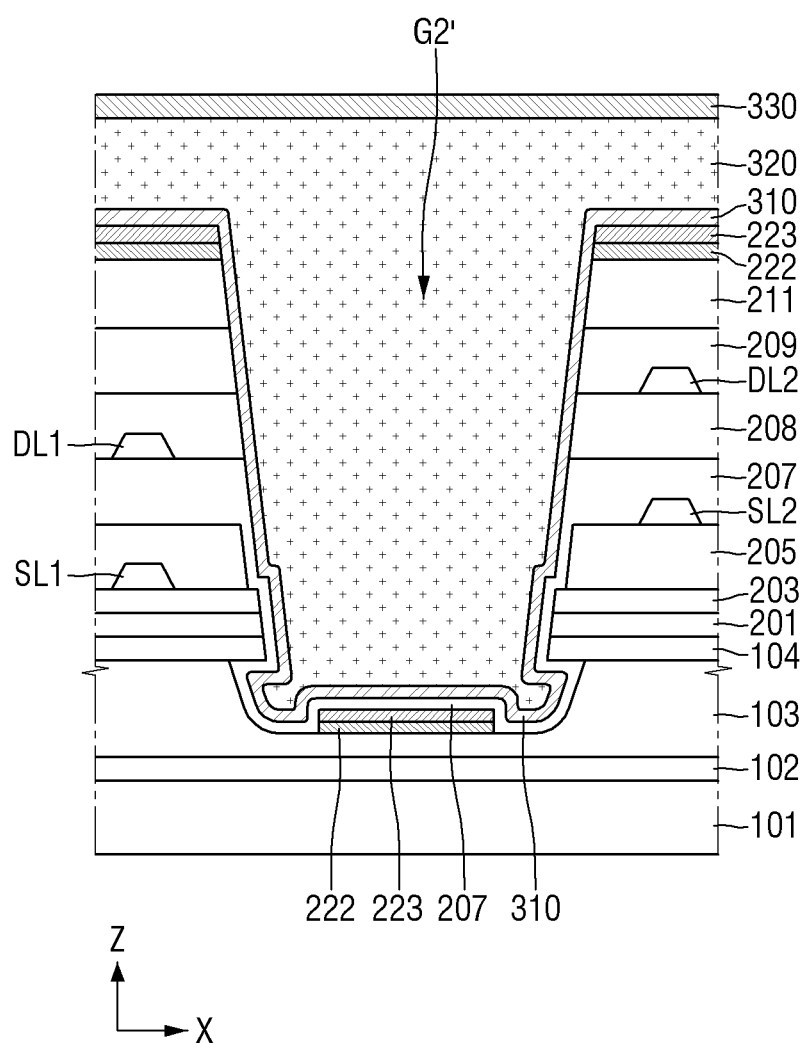
FIG. 14 is an enlarged schematic cross-sectional view illustrating an area C of FIG. 13.

FIG. 13 is an enlarged schematic cross-sectional view illustrating an area A (of FIG. 9) of a display device according to another embodiment of the disclosure. FIG. 14 is an enlarged schematic cross-sectional view illustrating an area C of FIG. 13.

In the embodiment of FIGS. 13 and 14, the inner surfaces of first through n-th grooves G1' through Gn' may be covered not only by a first inorganic encapsulation layer 310 of a thin-film encapsulation layer 300, but also by a second interlayer insulating layer 207, whereas in the embodiment of FIGS. 11 and 12, the inner surfaces of the first through n-th grooves G1 through Gn may be covered only by the first inorganic encapsulation layer 310.

Specifically, referring to FIG. 13, scan lines (SL1 and SL2) may be alternately arranged with an insulating layer interposed therebetween. For example, first scan lines SL1 may be disposed on a gate insulating layer 203 at intervals of a distance in an X-axis direction, and second scan lines SL2 may be disposed on a first interlayer insulating layer 205 at intervals of a distance in the X-axis direction. The first scan lines SL1 and the second scan lines SL2 may be alternately arranged not to overlap each other in a Z-axis direction with the first interlayer insulating layer 205 interposed therebetween.

In a case where the scan lines (SL1 and SL2) may be disposed above and below an insulating layer (e.g., the first interlayer insulating layer 205), the gap (or pitch) between pairs of adjacent scan lines (SL1 and SL2) can be reduced, and the width of a first non-display area NDA1 can be reduced.

Data lines DL may be alternately arranged with an insulating layer interposed therebetween, as illustrated in FIG. 13. For example, first data lines DL1 may be disposed on the second interlayer insulating layer 207 at intervals of a distance in the X-axis direction, and second data lines DL2 may be disposed on a first organic insulating layer 208 at intervals of a distance in the X-axis direction. The first data lines DL1 and the second data lines DL2 may be alternately arranged not to overlap each other in the Z-axis direction with the first organic insulating layer 208 interposed therebetween.

In a case where the data lines (DL1 and DL2) may be disposed above and below an insulating layer (e.g., the first organic insulating layer 208), the gap (or pitch) between pairs of adjacent data lines (DL1 and DL2) can be reduced, and the width of the first non-display area NDA1 can be reduced.

As another example, the scan lines (SL1 and SL2) and the data lines (DL1 and DL2) may be disposed on the same insulating layer.

The first through n-th grooves G1' through Gn' may be formed in a first sub-non-display area SNDA1, particularly, in one region between the scan lines (SL1 and SL2) and the data lines (DL1 and DL2).

For example, as illustrated in FIG. 13, the first scan lines SL1 and the first data lines DL1 may be disposed to overlap each other in the Z-axis direction, and the second scan lines SL2 and the second data lines DL2 may be disposed to overlap each other in the Z-axis direction. Ten scan lines (SL1 and SL2) and ten data lines (DL1 and DL2) may be disposed between the first and second grooves G1' and G2'. Ten scan lines (SL1 and SL2) and ten data lines (DL1 and DL2) may also be disposed between the (n−1)-th and n-th grooves Gn−1' and Gn'.

Bypass wires (SL and DL) may be alternately arranged with insulating layers interposed therebetween, in each bypass region, so that a total of about 60 bypass wires may be provided in a clockwise or counterclockwise direction. One groove G may be formed for every ten bypass wires. For example, if there may be a total of about 60 bypass wires (SL and DL), a total of five grooves G, i.e., the first through fifth grooves G1' through G5', may be formed between the bypass wires (SL and DL).

Referring to FIG. 13, each of the first through n-th grooves G1' through Gn' may have an undercut structure. The first through n-th grooves G1' through Gn' may be formed in a multilayer film including inorganic layers and organic layers. For example, the first through n-th grooves G1' through Gn' may be formed by removing parts of a substrate 100 that include layers.

The first through n-th grooves G1' through Gn' may be formed by etching a second base layer 103 and a second inorganic layer 104 of the substrate 100, a buffer layer 201, and a gate insulating layer 203. FIG. 13 illustrates that the first through n-th grooves G1' through Gn' may be formed by removing parts of the second base layer 103, the second inorganic layer 104, the buffer layer 201, and the gate insulating layer 203.

In one embodiment, the first and second interlayer insulating layers 205 and 207, the first organic insulating layer 208, a second organic insulating layer 209, and a pixel-defining layer 211 may also be partially removed to form parts of the first through n-th grooves G1' through Gn'.

Each of the first through n-th grooves G1' through Gn' may have an undercut structure. Each of the first through n-th grooves G1' through Gn' may have an undercut structure that may be wider in the second base layer 103 than in inorganic insulating layers, for example, in the second inorganic layer 104, the buffer layer 201, and the gate insulating layer 203. Due to the undercut structure of each of the first through n-th grooves G1' through Gn', some of the layers of a middle layer 222 (e.g., first and second functional layers) and a counter electrode 223 may be disconnected.

The second interlayer insulating layer 207 may cover the inner surfaces of the first through n-th grooves G1' through Gn'. The first inorganic encapsulation layer 310 may also cover the inner surfaces of the first through n-th grooves G1' through Gn'. As illustrated in FIG. 14, an organic encapsulation layer 320 may cover the second groove G2' and may fill the second groove G2', on the first inorganic encapsulation layer 310.

In one embodiment, the second interlayer insulating layer 207 may be formed to cover the first through n-th grooves G1' through Gn', and then, the first and second organic insulating layers 208 and 209 and the pixel-defining layer 211 may be stacked on each other. The first and second organic insulating layers 208 and 209 and the pixel-defining layer 211 may be removed from the first through n-th grooves G1' through Gn' through patterning. Thereafter, the middle layer 222 and the counter electrode 223 may be sequentially stacked on each other, and the inner surfaces of the first through n-th grooves G1' through Gn' may be covered again with the first inorganic encapsulation layer 310.

The organic encapsulation layer 320 may be formed by applying a monomer on the substrate 100 and curing the monomer.

Since the inner surfaces of the first through n-th grooves G1' through Gn' may be covered twice with the first inorganic encapsulation layer 310 and the second interlayer insulating layer 207, an improved water repellent effect can be provided.

Figure 15:
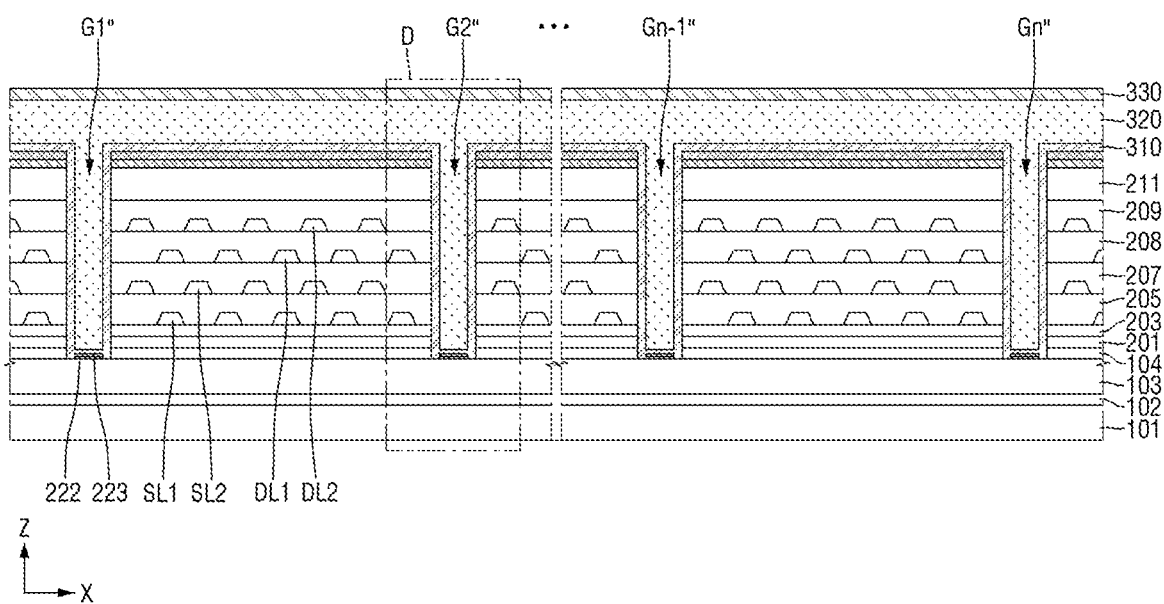
FIG. 15 is an enlarged schematic cross-sectional view illustrating an area A (of FIG. 9) of a display device according to another embodiment of the disclosure.
Figure 16:
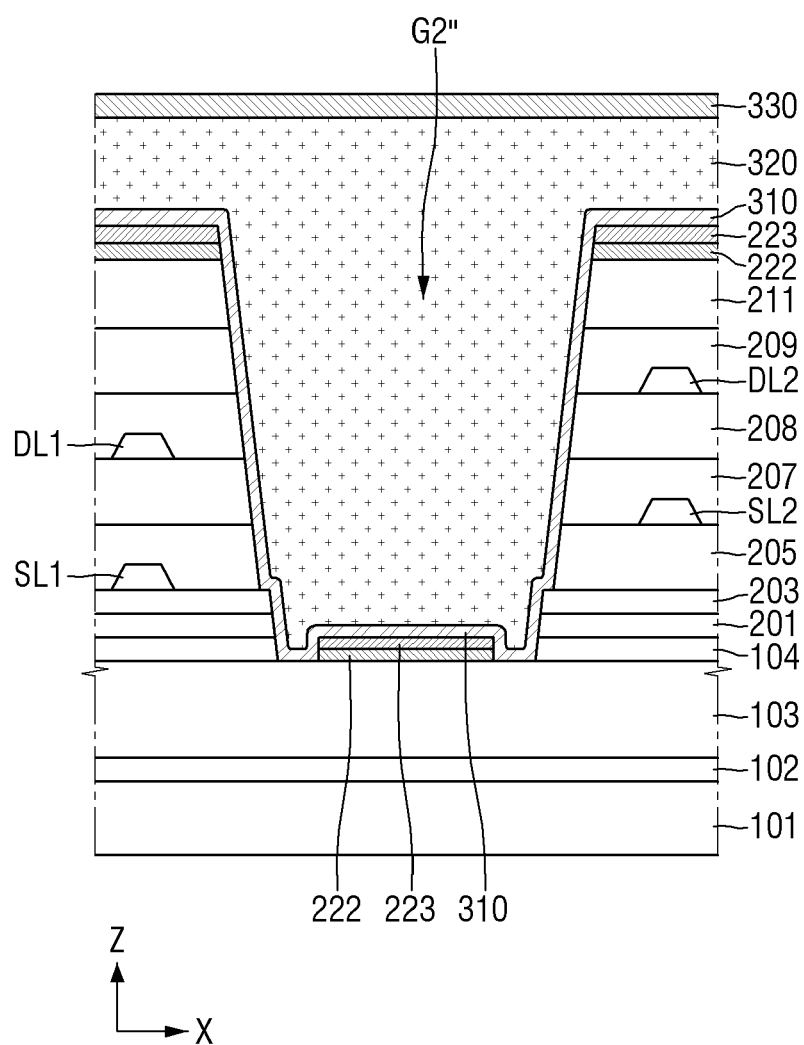
FIG. 16 is an enlarged schematic cross-sectional view illustrating an area D of FIG. 15.

FIG. 15 is an enlarged schematic cross-sectional view illustrating an area A (of FIG. 9) of a display device according to another embodiment of the disclosure. FIG. 16 is an enlarged schematic cross-sectional view illustrating an area D of FIG. 15.

In the embodiment of FIGS. 15 and 16, first through n-th grooves G1" through Gn" may be formed only on a substrate 100 (e.g., partially through), whereas in the embodiment of FIGS. 11 and 12, the first through n-th grooves G1' through Gn' may be formed even on the inside of the substrate 100.

Specifically, referring to FIG. 15, scan lines (SL1 and SL2) may be alternately arranged with an insulating layer interposed therebetween. For example, first scan lines SL1 may be disposed on a gate insulating layer 203 at intervals of a distance in an X-axis direction, and second scan lines SL2 may be disposed on a first interlayer insulating layer 205 at intervals of a distance in the X-axis direction. The first scan lines SL1 and the second scan lines SL2 may be alternately arranged not to overlap each other in a Z-axis direction with the first interlayer insulating layer 205 interposed therebetween.

In a case where the scan lines (SL1 and SL2) may be disposed above and below an insulating layer (e.g., the first interlayer insulating layer 205), the gap (or pitch) between pairs of adjacent scan lines (SL1 and SL2) can be reduced, and the width of a first non-display area NDA1 can be reduced.

Data lines DL may be alternately arranged with an insulating layer interposed therebetween, as illustrated in FIG. 15. For example, first data lines DL1 may be disposed on the second interlayer insulating layer 207 at intervals of a distance in the X-axis direction, and second data lines DL2 may be disposed on a first organic insulating layer 208 at intervals of a distance in the X-axis direction. The first data lines DL1 and the second data lines DL2 may be alternately arranged not to overlap each other in the Z-axis direction with the first organic insulating layer 208 interposed therebetween.

In a case where the data lines (DL1 and DL2) may be disposed above and below an insulating layer (e.g., the first organic insulating layer 208), the gap (or pitch) between pairs of adjacent data lines (DL1 and DL2) can be reduced, and the width of the first non-display area NDA1 can be reduced.

As another example, the scan lines (SL1 and SL2) and the data lines (DL1 and DL2) may be disposed on the same insulating layer.

The first through n-th grooves G1" through Gn" may be formed in a first sub-non-display area SNDA1, particularly, in one region between the scan lines (SL1 and SL2) and the data lines (DL1 and DL2).

For example, as illustrated in FIG. 15, the first scan lines SL1 and the first data lines DL1 may be disposed to overlap each other in the Z-axis direction, and the second scan lines SL2 and the second data lines DL2 may be disposed to overlap each other in the Z-axis direction. Ten scan lines (SL1 and SL2) and ten data lines (DL1 and DL2) may be disposed between the first and second grooves G1" and G2". Ten scan lines (SL1 and SL2) and ten data lines (DL1 and DL2) may also be disposed between the (n−1)-th and n-th grooves Gn−1" and Gn".

Bypass wires (SL and DL) may be alternately arranged with insulating layers interposed therebetween, in each bypass region, so that a total of about 60 bypass wires may be provided in a clockwise or counterclockwise direction. One groove G may be formed for every ten bypass wires. For example, if there may be a total of about 60 bypass wires (SL and DL), a total of five grooves G, i.e., the first through fifth grooves G1" through G5", may be formed between the bypass wires (SL and DL).

Referring to FIG. 15, the first through n-th grooves G1" through Gn" may be formed on a multilayer film including inorganic layers and organic layers. For example, the first through n-th grooves G1" through Gn" may be formed by removing parts of a substrate 100 that include layers.

The first through n-th grooves G1" through Gn" may be formed by etching a second inorganic layer 104, a buffer layer 201, a gate insulating layer 203, first and second interlayer insulating layers 205 and 207, first and second organic insulating layers 208 and 209, and a pixel-defining layer 211.

Due to the structure of each of the first through n-th grooves G1" through Gn", some of the layers of a middle layer 222 (e.g., first and second functional layers) and a counter electrode 223 may be disconnected.

A first inorganic encapsulation layer 310 of a thin-film encapsulation layer 300 may cover the inner surfaces of the first through n-th grooves G1" through Gn". As illustrated in FIG. 16, an organic encapsulation layer 320 may cover the second groove G2" and may fill the second groove G2", on the first inorganic encapsulation layer 310.

The organic encapsulation layer 320 may be formed by applying a monomer on the substrate 100 and curing the monomer.

Since the first through n-th grooves G1" through Gn" may be formed only on the substrate 100, the amount of time that it takes to fabricate a display device 1 can be shortened, and the probability of moisture penetration through the substrate 100 can be reduced.

The effects of the invention are not limited by the foregoing, and other various effects are anticipated herein.

Although the embodiments of the invention have been disclosed for illustrative purposes, those skilled in the art will appreciate that various modifications, additions and substitutions are possible, without departing from the scope and spirit of the invention as disclosed in the accompanying claims, including any equivalents.

Embodiments of the disclosure have been described above with reference to the accompanying drawings, but those of ordinary skill in the art to which the disclosure pertains should understand that the disclosure may be practiced in other specific forms without changing the technical idea or essential features of the disclosure. Therefore, the embodiments described above should be understood as being illustrative in all aspects instead of limiting.

What is claimed is:

1. A display device comprising:
   a substrate including:
      an opening area in a display area; and
      a non-display area between the display area and the opening area;
   signal wires disposed in the non-display area to bypass the opening area; and
   at least one groove disposed between the signal wires.

2. The display device of claim 1, wherein
   the at least one groove includes two or more grooves, and each of the grooves is disposed between adjacent ones of the signal wires.

3. The display device of claim 1, wherein the substrate includes a first base layer, a first inorganic layer, a second base layer, and a second inorganic layer, which are sequentially stacked on each other.

4. The display device of claim 3, wherein a bottom of the at least one groove is disposed on a surface of the second base layer.

5. The display device of claim 3, wherein a bottom of the at least one groove is disposed in part of the second base layer.

6. The display device of claim 5, wherein
   the signal wires include scan lines and data lines,
   the scan lines are alternately arranged with an insulating layer disposed between the scan lines, and
   the data lines are alternately arranged with an insulating layer disposed between the data lines.

7. The display device of claim 6, wherein
   the scan lines include:
      first scan lines disposed on a first insulating layer on the second inorganic layer; and
      second scan lines disposed on a second insulating layer on the first insulating layer, and
   the data lines include:
      first data lines disposed on a third insulating layer on the second insulating layer; and
      second data lines disposed on a fourth insulating layer on the third insulating layer.

8. The display device of claim 7, wherein
   the first scan lines and the first data lines are disposed to overlap each other in a thickness direction of the display device, and
   the second scan lines and the second data lines are disposed to overlap each other in the thickness direction.

9. The display device of claim 7, wherein the at least one groove comprises a plurality of grooves that are disposed between the first scan lines and the second scan lines and between the first data lines and the second data lines.

10. The display device of claim 7, wherein a width of the at least one groove in the second base layer is greater than a width of the at least one groove in the second inorganic layer.

11. The display device of claim 7, wherein the third insulating layer covers an inner surface of the at least one groove.

12. The display device of claim 3, further comprising:
    a fifth insulating layer disposed on the signal wires; and
    an organic light-emitting layer and a counter electrode layer sequentially stacked on each other on the fifth insulating layer.

13. The display device of claim 12, wherein the organic light-emitting layer and the counter electrode layer are sequentially stacked on each other on a bottom of the at least one groove.

14. The display device of claim 1, further comprising:
    a thin-film encapsulation layer covering the display area and the non-display area.

15. The display device of claim 14, wherein the thin-film encapsulation layer includes a first inorganic encapsulation layer, an organic encapsulation layer, and a second inorganic encapsulation layer, which are sequentially stacked on each other.

16. The display device of claim 15, wherein the first inorganic encapsulation layer covers an inner surface of the at least one groove.

17. The display device of claim 15, wherein the organic encapsulation layer fills the at least one groove.

18. The display device of claim 15, further comprising:
    a partition wall disposed between the opening area and an area where the signal wires are disposed.

19. The display device of claim 18, wherein the first inorganic encapsulation layer and the second inorganic encapsulation layer are sequentially stacked on each other on the partition wall.

20. The display device of claim 18, further comprising:
    a planarization layer disposed on a portion of the second inorganic encapsulation layer, wherein the portion of the second inorganic encapsulation layer is disposed between the partition wall and the opening area.

* * * * *